(12) United States Patent
Hsu et al.

(10) Patent No.: US 7,884,359 B2
(45) Date of Patent: Feb. 8, 2011

(54) INTEGRALLY GATED CARBON NANOTUBE IONIZER DEVICE

(75) Inventors: David S. Y. Hsu, Alexandria, VA (US); Jonathan L Shaw, Springfield, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 30 days.

(21) Appl. No.: 12/489,105

(22) Filed: Jun. 22, 2009

(65) Prior Publication Data
US 2009/0283693 A1    Nov. 19, 2009

Related U.S. Application Data

(63) Continuation-in-part of application No. 12/420,160, filed on Apr. 8, 2009, which is a continuation-in-part of application No. 11/452,567, filed on Jun. 9, 2006, now Pat. No. 7,535,014.

(60) Provisional application No. 61/129,395, filed on Jun. 23, 2008.

(51) Int. Cl.
*H01L 29/06* (2006.01)
*H01L 23/02* (2006.01)
*H01L 23/48* (2006.01)
*H01L 29/40* (2006.01)
*H01L 21/3205* (2006.01)

(52) U.S. Cl. .............................. 257/40; 257/9; 257/678; 257/746; 438/595; 438/585; 438/591; 977/938; 977/936; 977/876

(58) Field of Classification Search ................... 257/9, 257/40, 678, 746; 438/22, 48, 775, 595, 438/598, 584, 585, 591, 589, 776, 777, 778, 438/780; 977/938, 876, 936
See application file for complete search history.

(56) References Cited

U.S. PATENT DOCUMENTS

| | | | | |
|---|---|---|---|---|
| 6,339,281 B2 * | 1/2002 | Lee et al. | ..................... | 313/309 |
| 6,830,981 B2 * | 12/2004 | Lee et al. | ..................... | 438/309 |
| 7,429,820 B2 * | 9/2008 | Howard et al. | .............. | 313/495 |
| 2010/0144104 A1 * | 6/2010 | Okita | .......................... | 438/197 |

* cited by examiner

*Primary Examiner*—Chuong A. Luu
(74) *Attorney, Agent, or Firm*—Amy L. Ressing; Stephen T. Hunnius (57) ABSTRACT

Described herein is a field ionization and electron impact ionization device consisting of carbon nanotubes with microfabricated integral gates that is capable of producing short pulses of ions.

21 Claims, 5 Drawing Sheets

INTEGRALLY GATED CARBON NANOTUBE IONIZER DEVICE

This application is a continuation in part application of U.S. application Ser. No. 11/452,567 filed on Jun. 9, 2006 now U.S. Pat. No. 7,535,014 and the divisional application Ser. No. 12/420,160 filed on Apr. 8, 2009 and claims the benefit of provisional application No. 61/129,395 filed on Jun. 23, 2008 the entireties of all are herein incorporated by reference.

Described herein is a field ionization and electron impact ionization device comprising carbon nanotubes with microfabricated integral gates that is capable of producing short pulses of ions.

Atoms or molecules can become field ionized in the presence of strong electric field in the proximity of a sharp tip biased positive relative to a cathode, yielding positive ions. [R. Gomer, Field emission and field ionization, Harvard Univ. press, 1961, Cambridge, Mass.]. Electrons tunnel from the atom or molecule into the tip, followed by the ejection of the resulting positive ion from the tip region.

The first work on field ionization was performed by Muller in 1953 [E. W. Muller, Ergeb. Exakt. Naturwiss. 27, 290 (1953)] who used a sharp single crystal tungsten needle biased positively to thousands of volts. It was observed that closer the molecule is to the tip surface (such as in the adsorbed state), the lower the field required for field ionization and the narrower the ion energy distribution becomes [Gomer]. In addition, the more polarizable the molecule, the higher is the probability of field ionization, due to the longer time the molecule spends in the ionization zone as a result of the attraction. This also applies to molecules in a liquid film state on the tip surface as they spend longer time than a gas in the ionization zone.

A natural application of field ionization is the ion source for mass spectrometry. The unique advantage here is that field ionization produces no internal excitation (vibrational, electronic) which leads to very little breakup of the molecule. whereas the more conventional electron impact ionization causes fragmentation of the parent molecule.

For example, field ionized acetone has just one major mass peak, whereas electron impact ionization produces 18 mass fragment peaks [Gomer]. The "soft" field ionization process vastly simplifies mass spectroscopic analysis, and would be of great value for the detection of large molecules such as proteins and other biological molecules.

In order to increase the ion currents, many field ionizer arrangements commonly using large and dense arrays of sharp needles, whiskers, and even nanorods have been used. These all do not have microfabricated gates and usually require high voltages. High voltages result in high molecular ion energies which is undesirable due to their fragmenting upon impact with the ion collector.

Microfabricated field ionizers with microns-size diameter integrated gates have been previously fabricated to greatly reduce the voltage for field ionization [C. A. Spindt, Surface Science 266, 145 (1992): B. Ghodsian, et al, IEEE Electron Device Letters 19, 241 (1998)]. Spindt's "microvolcano" field ionizer array used a microfabricated hollow, volcano-shaped metal cone through which the gas was injected from the backside. Some aspects of gas injection from the backside and forcing all the gas to flow through the ionizer tip can be found in the prior art. However, the present invention differs dramatically and offers advantages over Spindt's microvolcano ionizer as the carbon nanotubes can be on the sidewalls of the field ionizer apertures, which, due to their extreme sharpness and high aspect ratio, allows for lower voltages.

Another aspect of the present invention is that the carbon nanotubes have a larger capacity and higher surface-to-volume ratio for adsorbing gases than the metal film in Spindt's microvolcanos. Field ionization efficiency is greatly enhanced by the higher surface concentration of gases (due to higher adsorption) in the ionization zone. The large surface-to-volume ratio of the nanotubes also facilitates allows liquid analytes to wick up the nanotube into the ionization zone in high molecular concentration of the liquid form.

DETAILED DESCRIPTION

Figure 3:
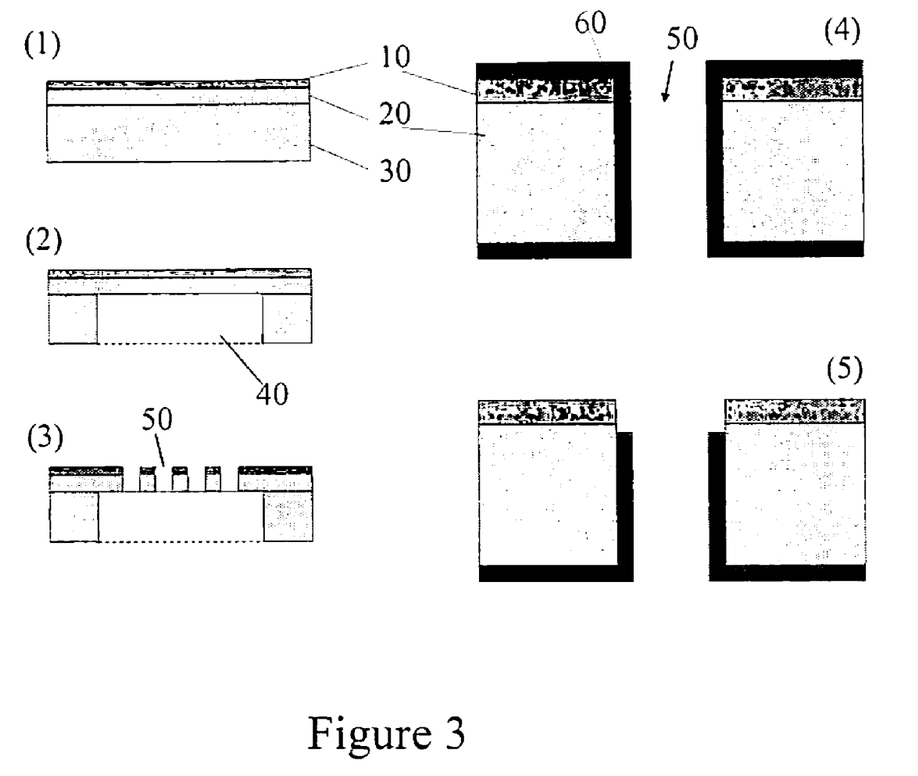
FIG. 3 shows a schematic of five views of a field ionization device.
Figure 4:
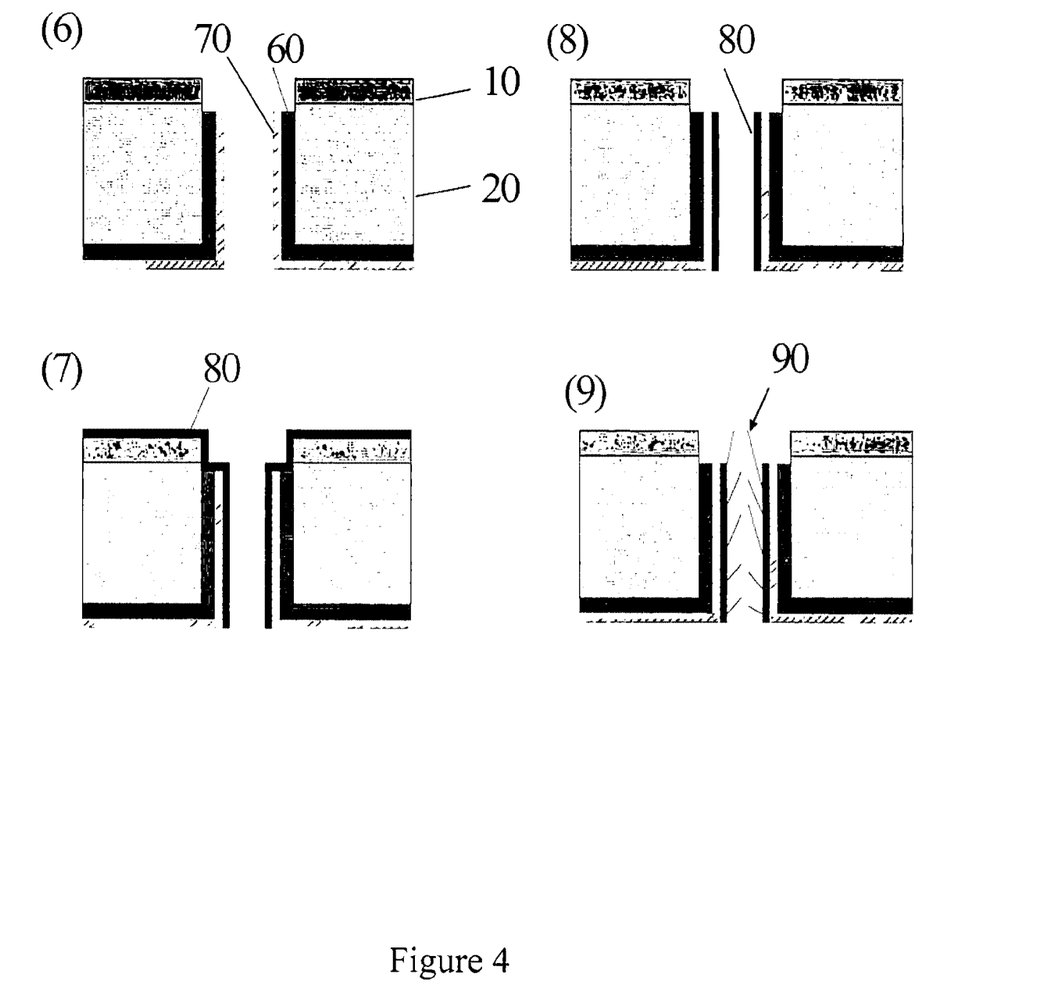
FIG. 4 shows a schematic of four views of a field ionization device.
Figure 5:
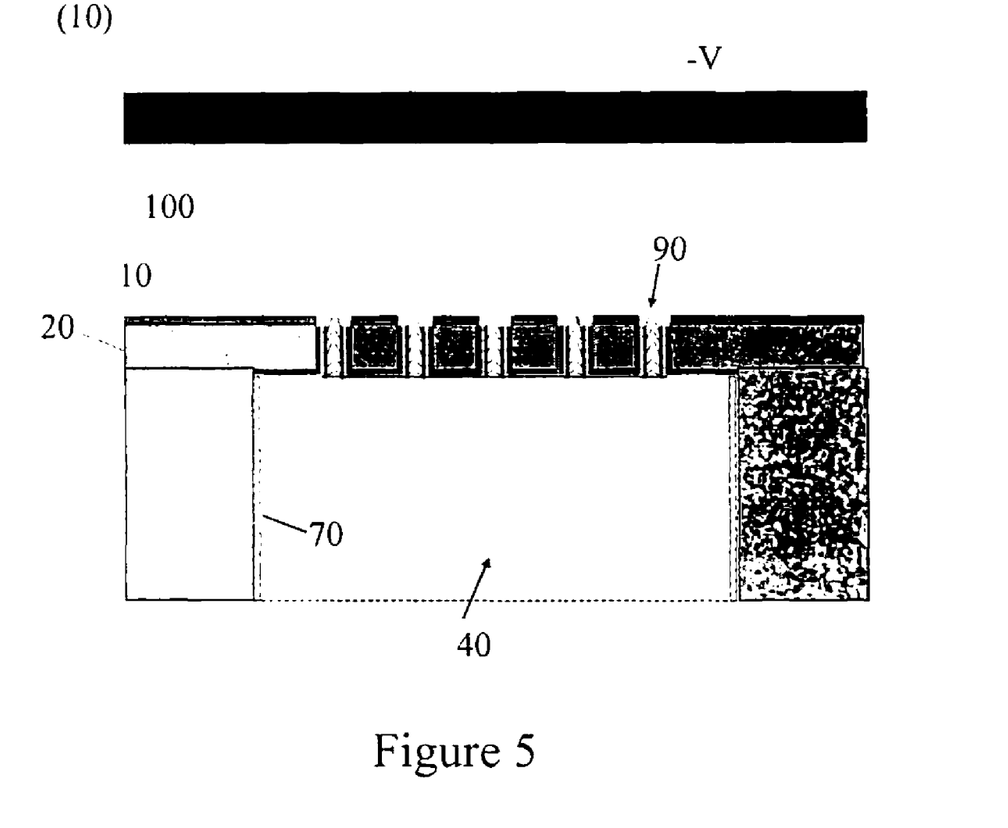
FIG. 5 shows a schematic of one view of a field ionization device.

As in FIGS. 3, 4, and 5, a field ionization device (300) can include a substrate (30) and a gate (10), a first insulator layer (20) positioned between the substrate (30) and the gate (10) with an aperture (50) in the gate (10) and the insulator (20) forming an interior wall. The device further includes a second insulator layer (60) on the interior wall, a metallization layer (70) on the second insulator layer (60), a catalyst layer (80) on the metallization layer (70), and a carbon nanotube (90) on the catalyst layer (80).

The field ionization device (300) can include a collector (100).

The field ionization device (300) can be such wherein the gate (10) is biased negative with respect to the carbon nanotube (90) or wherein the collector (100) is biased more negative than the gate (10).

The field ionization device (300) can further include an electric field between the carbon nanotube (90) and the gate (10).

A gas can have access to the carbon nanotube (90). Or a liquid containing analytes can have access to the carbon nanotube (90).

The substrate (30) of the field ionization device (300) can be a semiconductor or a conductor. The insulator can be a high resistivity material such as silicon dioxide or silicon nitride. The metallization layer (70) can be a conductor with strong adhesion to the second insulator. Examples of the metallization layer (70) can be Cr, Ti, W, Ta, or TiN. The catalyst layer (80) can be Ni, Co, Fe, Pd, alloys thereof, or combinations thereof. The catalyst layer (80) can also serve as the metallization layer (70) on the sidewalls of the second insulator in the aperture.

It will be understood that one embodiment of the field ionization device (300) can include multiple carbon nanotube (90)s.

Furthermore, other embodiments are possible and can include wherein the carbon nanotube (90) is located near the top of the metallization layer (70) or wherein the carbon nanotube (90) is located near the top of the second insulator layer or wherein the carbon nanotube (90) is located on the interior wall.

Yet another embodiment of the field ionization device (300) can include an array of multiple devices as described herein.

Still further, another embodiment of a field ionization device (300) can include a first insulator layer (20) on a first side of a substrate (30), a conductive gate (10) layer on the first insulator layer (20), a cavity in the substrate (30), a portion of first insulator over the cavity, an aperture (50) in the portion of the first insulator layer (20) and the conductive gate (10) layer thereby forming an aperture (50) and aperture (50) sidewall. Additionally, the field ionization device (300) can include a second insulator layer on the aperture (50) sidewall on the first insulator layer (20) and surface of the cavity, a metallization layer (70) over the second insulator layer on the aperture (50) sidewall and on surface of the cavity, a catalyst layer (80) on the metallization layer (70) on the second insulator on the aperture (50) sidewall, and a carbon nanotube (90) on the catalyst layer (80) on the metallization layer (70) on the second insulator on the aperture (50) sidewall.

The cavity can be made by etching a second side of the substrate (30) to near the insulator layer, wherein the second side is opposite the first side. The carbon nanotube (90) can be grown from the catalyst layer (80) on the metallization layer (70) on the second insulator layer (60) on the aperture (50) sidewall. The catalyst layer (80) can serve as the metallization layer (70) on the sidewalls on the second insulator layer (60) in the aperture (50). The catalyst layer (80) can be on the second insulator layer (60) in the aperture (50) and thus no metallization layer (70) may be needed. With one embodiment, it can be preferable to have only catalyst in the aperture (50).

The device can further include a collector (100) located near the carbon nanotube (90). The conductive gate (10) layer can be biased negative with respect to the carbon nanotube (90). The collector (100) can be biased more negative than the conductive gate (10) layer. An electric field can exist between the carbon nanotube (90) and the conductive gate (10) layer.

The substrate can be a semiconductor or a conductor. The insulator can be a high resistivity material such as silicon dioxide or silicon nitride. The metallization layer can be a conductor with strong adhesion to the second insulator. The metallization layer can be selected from the group consisting of Cr. Ti, W, Ta, and TiN.

The catalyst layer can be selected from the group consisting of Ni, Co, Fe, Pd, alloys thereof, and combinations thereof. Furthermore, the device can include multiple carbon nanotubes.

A gas can flow through the aperture (50) in the substrate (30), the first insulator layer (20). the second insulator, the metallization layer (70), and the conductive gate (10) layer. Or a liquid containing analytes can flow through the aperture (50) in the substrate (30), the first insulator layer (20), second insulator layer (60), the metallization layer (70), and the conductive gate (10) layer. A gas can have access to the carbon nanotube. Or a liquid containing analytes can have access to the carbon nanotube.

The catalyst layer can reside on the metallization layer only in said aperture. The device can have the metallization layer in the aperture as the catalyst layer.

Another embodiment can include an array of multiple devices as described herein.

A method of making a field ionization device (300) can include forming a first insulator layer (20) on a first side of a substrate (30), depositing a conductive gate (10) layer on the first insulator layer (20), forming a cavity in the substrate (30) by etching a second side of the substrate (30) to near the first insulator layer (20), wherein the second side is opposite the first side and wherein a portion of the first insulator is over the cavity, etching an aperture (50) in the portion of the first insulator layer (20) and the conductive gate (10) layer to form an aperture (50) and aperture (50) sidewall, depositing a second insulator layer (60) on the substrate (30) and the first insulator layer (20) and the aperture (50) sidewall and the conductive gate (10) layer, removing the second insulator layer (60) from the top surface, depositing a metallization layer (70) over the second insulator layer (60) on the aperture (50) sidewall and on surface of the cavity, depositing a catalyst layer (80) on the metallization layer (70) on the second insulator on the aperture (50) sidewall, and growing a carbon nanotube (90) from the catalyst on the metallization layer (70) on the second insulator layer (60) on the aperture (50) sidewall.

Furthermore the method can include patterning that can be done by lithography.

Still furthermore, the method can include locating a collector (100) near the top surface.

The electric field strength required for field ionization can be several times higher than the reverse field required for field emission. which can push the limits of dielectric breakdown for insulator materials used in the microgated device. This is where extremely sharp and high aspect ratio structures can have an advantage in reducing the voltage required to achieve the required field strength.

Carbon nanotubes (CNTs) have extremely small diameters (small nanometers) and high aspect ratios. In the recent years, they have been extensively studied as field electron emitters and have become premier candidates on account of their natural geometry and superior electronic and material properties. The overwhelming majority of the studies used a diode configuration in which an electrode (anode) placed near a grounded CNT-populated substrate is biased positive.

The bias voltages are in general hundreds of volts on account of the macroscopic anode-CNT separation. A few groups, including this laboratory, have managed to microgate the CNTs by growing CNTs directly into microgated structures. Electron emission is induced by applying a positive voltage on the gate electrode and collected on an anode (in a triode structure). Because the microgates are much closer to the CNTs (~micron), the required bias voltage (on the gate electrode) becomes much lower than in the diode configuration.

Because of the nanotubes and the microgating, the high electric field required can be achieved more easily than with other materials.

Figure 2:
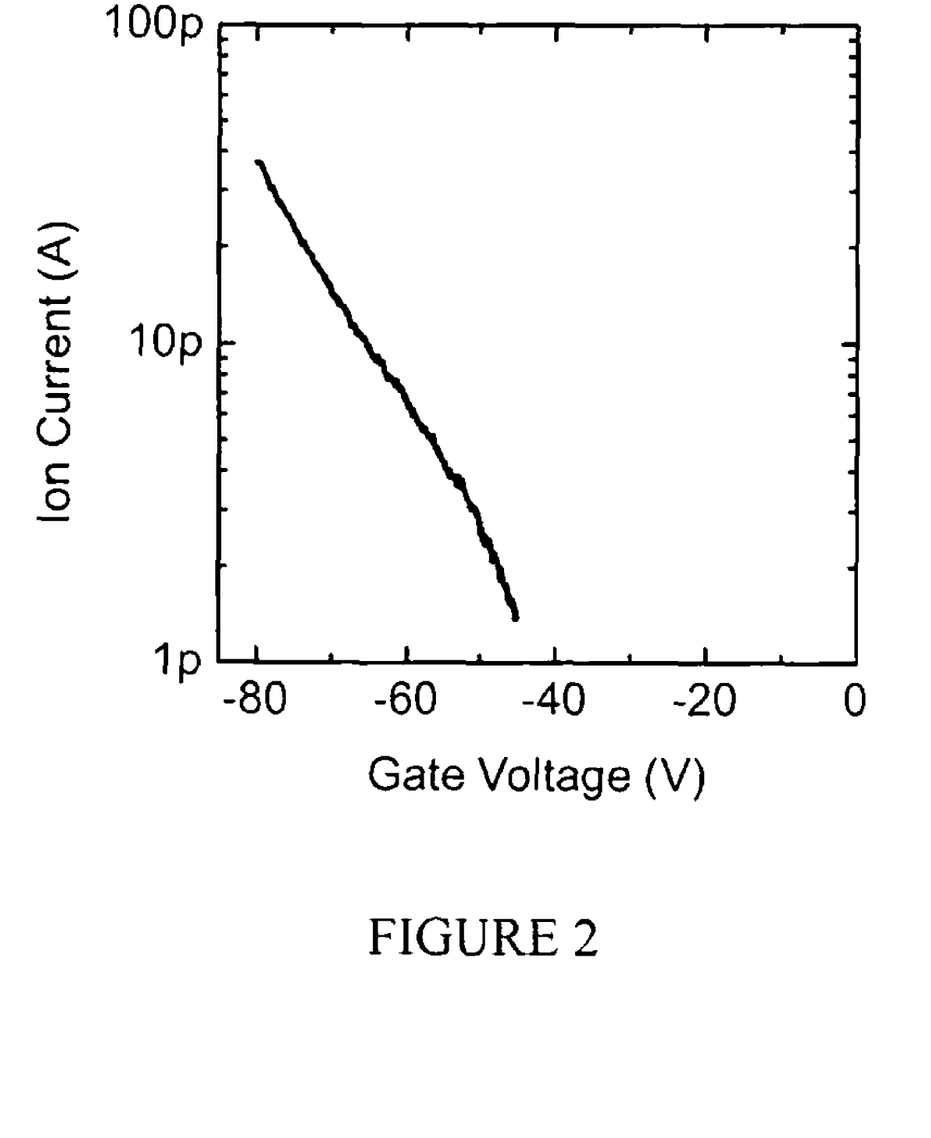
FIG. 2 shows the graph of ion current as a function of gate voltage for the field ionization of hydrogen.

Here, a carbon nanotube field ionizer has been demonstrated. A different configuration was used in which the carbon nanotubes were grown on gated silicon posts. By negatively biasing the gate in the presence of $10^{-4}$ Torr hydrogen, hydrogen has been field ionized and an ion current ($H_2^+/H^+$) as a function of gate voltage has been obtained as shown in FIG. 2.

The field ionizer device (300) can consist of an array of gated small through-apertures (50) in an insulator supported over a larger aperture (40) on a substrate (30) with carbon nanotubes (90) (CNTs) projecting from the aperture (50) sidewalls, as shown in FIG. 5. Each such small aperture (50) can be designated as a "field ionization cell." The CNTs can be in electrical contact with the substrate (30) and can be electrically insulated from the gate (10). During operation, the gate (10) can be biased negative with respect to the CNTs/substrate, and the collector (100) can be biased more negative than the gate (10). A strong electric field can be formed between the top CNTs and the gate (10). The gas can flow from the bottom larger aperture (40) in the substrate (30)

through the field ionization cells and the molecules in contact with the tip surfaces of the nanotubes (where the field is the strongest) can become ionized when sufficient voltage/field is applied. The positive ions can then be accelerated toward the collector (100) plate.

The fabrication process can start with depositing or growing an insulator layer (20) on a substrate (30), followed by the deposition of a conductive gate (10) layer, as shown in FIG. 3. Next, the backside of the substrate (30) can be etched through, until it stops at (or near) the insulator layer, forming a cavity (40). (FIG. 3). A conformal layer of insulator material 60 such as silicon dioxide can be deposited on the substrate (30), such as by using low pressure chemical vapor deposition (LPCVD) (FIG. 3). Then directional dry etching from the top or glancing angle sputtering can be used to remove the insulator layer (60) from only the top horizontal surfaces (FIG. 3). A metallization layer (70) can be deposited from the backside of the substrate (30) over the insulator layer (60) on the sidewalls of the apertures (50) and over the surfaces of the cavity (40) (FIG. 4). Next, a catalyst layer (80) can be deposited from the top side of the sample to coat the resulting insulator layer (60) sidewalls in aperture (50) and the top surface (FIG. 4). Glancing angle sputtering can be used to remove the catalyst layer (80) from the top horizontal surface (FIG. 4). Carbon nanotubes (90) can then be grown using CVD from the catalyst on the sidewall of the apertures (50), forming a "field ionizer cell" (FIG. 4). FIG. 5 shows an example device including an array of ionizer cells and an ion collector (100) plate.

The carbon nanotubes can be the field ionizer tip. Their extremely high aspect ratio and sharpness can produce higher local field strengths than most other materials at a given voltage in a microgated cell. Field ionization requires higher field strengths than field emission which means dielectric breakdown in the insulator can be a serious potential problem. The use of CNTs can overcome this problem by not requiring as high voltages to achieve the fields required for field ionization.

Carbon nanotubes have a larger capacity (also larger surface-to volume ratio) for adsorbing molecules on the surface and within the tube. The cross-section for field ionization can be greatly improved if the molecule starts in an adsorbed state on the tip.

The present design provides for 100% of the gases to have to pass through the ionizer cells which maximizes the fraction of molecules to be ionized.

The present design provides for a device wherein liquids with high vapor pressures can be used. Because the apertures can be small, liquid analytes in the cavity can wick up the small ionizer cell apertures and nanotubes and have an enhanced cross-section for field ionization.

Another embodiment for a field ionizer can be a device structure without the backside cavity, i.e. just the array of ionizer cells whose bottoms terminate in the solid substrate. The gas molecules can impinge on the nanotubes from the top aperture openings and can be less efficient. In fact field ionization results can be obtained by using another of the present CNT arrays (which have CNTs grown on gated silicon posts. as described in Hsu and Shaw, Appl. Phys. Lett., 80, 118 (2002), herein incorporated by reference. FIG. 2 shows example field ionization results.

EXAMPLE

Figure 1:
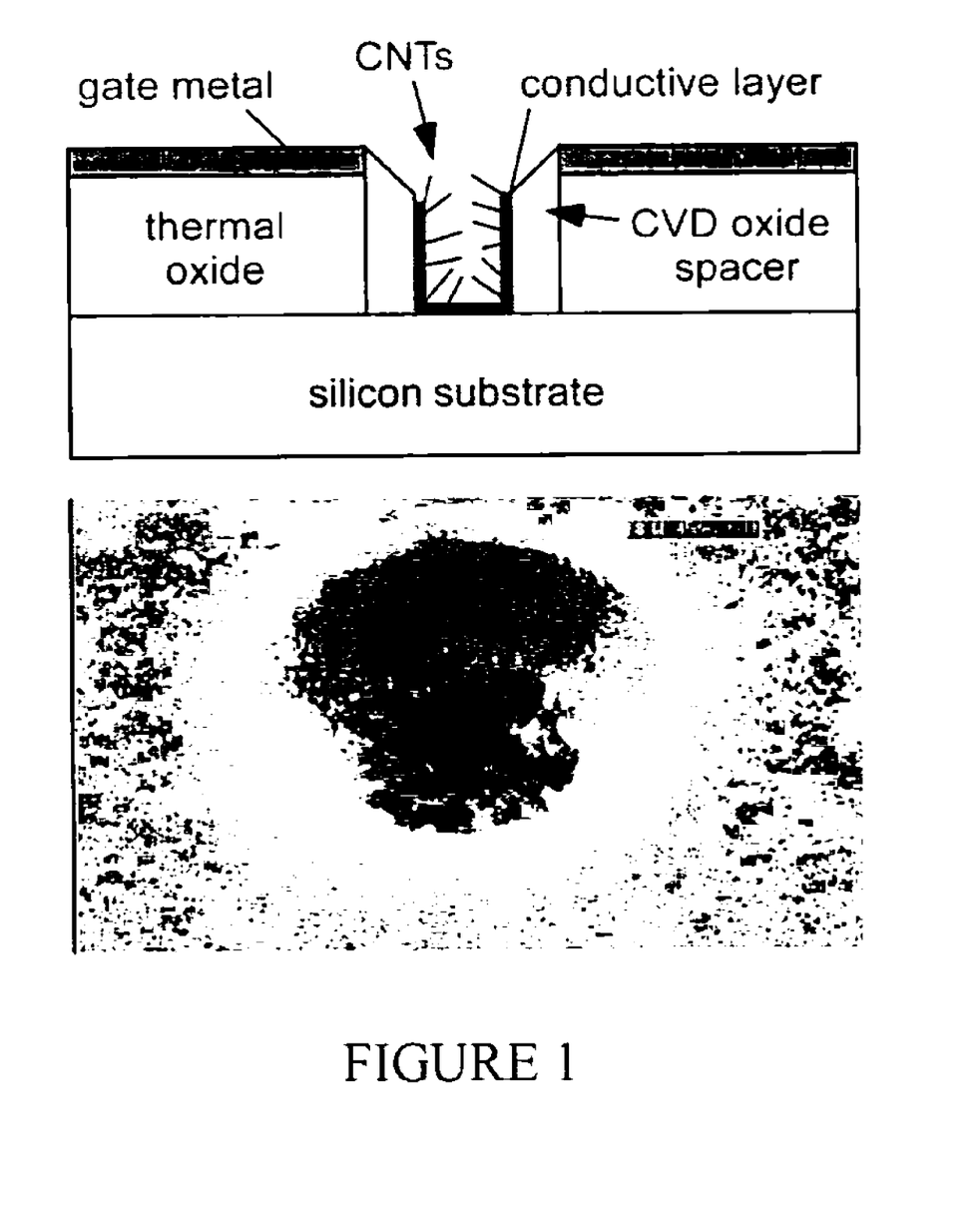
FIG. 1 shows a schematic and a scanning electron micrograph of one configuration of a gated CNT field emitter cell developed at NRL.

The operation has been demonstrated of a microgated carbon nanotube field emitter array in reverse bias as a field ionizer. We used a configuration of field emitter array, one emitter cell of which is shown in FIG. 1, in which the carbon nanotubes were grown in open gated apertures. By negatively biasing the gate in the presence of 0.1 Torr hydrogen we have field ionized hydrogen and obtained ion current ($H_2^+/H^+$) as a function of gate voltage shown in FIG. 2. The collector electrode was biased at −200V to measure the positive ions. We also ionized hydrogen with electron-impact ionization by operating the field emitter array with positive bias on the gate (in the electron emission mode). The field emitted electrons collide with hydrogen in the gas phase and adsorbed hydrogen on the gate surface to produce the positive ions ($H_2^+/H^+$). The results are shown in FIG. 3. We observed that the ion current scales linearly with the pressure, as shown in FIG. 4.

We also produced pulses of hydrogen ions by electron impact ionization from pulses of field-emitted electrons produced by pulsing the voltage on the gate electrode, as shown in FIG. 5. The base reference line shown in FIG. 5 is the DC hydrogen ion level at a fixed voltage (60 or 70V) and the pulsed component is obtained by a positive 10V pulse step on top of the DC voltage. The relatively slow rise and fall times are due to the use of instrumentation not suitable for high speed measurements.

The 0.1 Torr hydrogen pressure was used successfully without arcing or plasma formation. Presence of the high electric fields such as that used at such pressures with centimeter scale electrode separations normally run a high risk of plasma formation. One possible explanation for the lack of plasma formation in our device system is that the carbon nanotubes sit inside micron sized apertures whose diameter (or the nanotube-to-gate distance) is very much smaller (>$10^4$ times smaller) than the mean-free path of the gas at the pressure used (~5 cm at 0.1 Torr hydrogen) and no plasma can be initiated from inside these apertures. This consideration is exploited further in the present invention in which gases at much higher pressures can be flowed through small diameter channels and the emitter cells from the back of the wafer, without risk of plasma formation. The higher pressures in the emitter apertures will greatly enhance the flux of ion production.

One unique property of using the field emitter type ionizer is its inherent capability of producing short ion pulses. The pulse rise time is limited only by the speed of the switching electronics for the voltage rise on the gate electrode. The transit time of the electron or ion through the micron-distance in the microgate region is in the rpicosecond range. One can produce pulses in the nanosecond range with readily available electronics. In comparison, a conventional plasma ion source is limited to microsecond pulses due to the much longer transit time through macroscopic distances.

The ability to produce shorter-than 50 nanosecond deuterium or tritium ion pulses opens up a unique application in pulsed fast neutron analysis (PFNA). The fast neutron analysis (FNA) method, using conventional neutron tubes has been used in the past 50 years mainly for oil exploration but now has become a prime candidate for security detection of explosive and nuclear devices. Deuterium (or tritium) ions are accelerated up to 100 keV and collided with suitable deuteride targets to produce fast neutrons with 2.5 MeV or 14.2 MeV energy via D-D or D-T nuclear fusion reactions. Such high energy neutrons can penetrate thick casings and interact with explosive materials or nuclear materials through neutron-induced nuclear excitation or reaction to give off energetic products such as gamma rays and additional neutrons, which can be detected and analyzed as a signature of the material of interest.

In contrast, the present neutron tubes such as those marketed by the ThermoFisher Scientific Corporation are limited to longer than 5 microsecond pulses due to their plasma source. They are precluded from being used in time of flight (TOF) techniques to determine the location of the object of interest. TOF can be used only if the neutron pulse is short enough. The distance of the object from the neutron source can be determined by measuring the neutron time-of-flight; the starting time begins when the neutrons are created and the stop time is when the gamma rays are detected. The depth of image resolution is determined by the distance the fast neutron traverses during the pulse length. To have a depth of image resolution of 10 cm, a pulse length of 5 nanoseconds or less is required for the 2.5 MeV neutrons. This pulse length can be readily produced by our device. In contrast. the conventional neutron tubes, with their 5 microsecond pulses (during which the neutrons travel 100 meters), will have no usable depth of image resolution.

The subject invention enables the production of nanosecond deuterium or tritium ion pulses which lead to the production of nanosecond-fast neutron pulses which in turn enable the precise location of a shielded object of interest not possible by any other means. It could revolutionize security inspection of trucks and cargo shipping containers for explosives or nuclear devices.

The hydrogen ion current we have obtained in the pulse shown in FIG. 5, has already exceeded the output of ThermoFischer's neutron tubes. FIG. 5 shows 90 microamperes of hydrogen ion current. which is $5.6 \times 10^{14}$ ions/sec. The conversion factor to fast neutron production by the D-D reaction is $1/10^5$. which leads to $5.6 \times 10^9$ neutrons/sec. This is an order of magnitude higher than the ThermoFisher neutron tube's $10^8$ neutrons/sec. We point out that the total ionizer array chip area used in FIG. 5 is only 0.16 mm². By going to larger area or denser arrays, larger ion currents will result by using just the existing configuration of the emitter device. In the present invention, by using a higher pressure in the back-channel flow configuration, orders of magnitude increase in the ion current density can be expected.

Another advantage of the present design is that much higher pressures (up to tens of Torrs) inside the aperture channels can be used to greatly increase the ion current without risking plasma formation.

Another advantage of the present design is the ability to produce high current pulsed ions in the nanosecond regime.

Another advantage of the present design is the ability to produce nanosecond pulses of deuterium or tritium gas for the production of nanosecond pulses of fast neutrons to enable the precise location and identification of contraband objects (including nuclear bomb, explosives, illicit drugs, etc) by pulsed fast neutron analysis.

Another advantage is that the device is suitable for a lightweight and low cost pulsed fast neutron analysis system such as through insertion into the ThermoFisher neutron tube.

Another advantage is that the device can be readily fabricated as a line source which can greatly reduce the scanning time for PFNA.

The device is shown in FIG. 1, which has been scaled up to about 10,000 and 40,000 cells.

Short pulsed (nanoseconds) ion production has been demonstrated.

Ability to use many-Torrs pressure inside aperture channels has been demonstrated.

Unique and enabling application to precise image-resolved pulsed fast neutron analysis (with time-of-flight) of nuclear and explosive devices and other contraband materials.

Line source configuration of device to produce line neutron source to reduce scanning time in PFNA.

EXAMPLE

We have used micro-gated carbon nanotube field emitter arrays to produce hydrogen ions via two mechanisms; direct field ionization, and electron impact ionization. Recent changes in the process have improved the maximum emission current. The nanotubes are about 20 nm in diameter (possibly multiwalled) and the gate electrodes are made of Cr.

We made the measurements in a UHV chamber with base pressure<$10_{-10}$ torr, backfilled with purified $H_2$ gas. A wire probe held at −200 V and positioned about 1 mm above the array, served as the electron or ion collector; additional probes contacted the emitter substrate and extraction gate.

The field ionization current was plotted at three different hydrogen pressures. We were able to produce up to about 100 nA total ion current. The current increased linearly with hydrogen pressure. We limited the pressure to values below the point where plasma breakdown began to create measurable collector current. The effects of field and pressure are nearly independent, indicating that the $H_2$ molecules did not adsorb on the nanotubes. If the molecules did adsorb a significant fraction of a monolayer, the ion current would saturate with pressure.

It was shown that the ion current increased with gate voltage in a manner consistent with the Fowler-Nordheim equation. The slope of the lines did not change significantly with pressure, while the intercept increased linearly with pressure.

We found that higher currents could be produced at similar or lower gate voltages using impact ionization. In this mode we have recorded steady-state ion currents up to 20 μA. We also created current pulses up to 80 μA with a 10V gate pulse. To produce ions by impact ionization, we simply applied positive voltage to the gate, while keeping the collector voltage negative. In this configuration electrons emerge from the array with kinetic energies slightly below the gate potential, then the field from the ion collector retards their motion such that they return to the gate electrode.

Impact ionization can occur if the electrons encounter a neutral during the portion of their trajectory when they have sufficient energy. The geometry are similar, except that the trajectories are shorter. The length of the electron trajectory, and the maximum distance above the gate electrode increases with the gate potential and with less negative collector potentials. If hydrogen molecules become adsorbed on the surface of the gate electrode, ionization can also occur at that point, however we see no evidence that a significant portion of the ion current shown is produced this way.

It was shown that the electron current and ion currents were obtained at three hydrogen pressures. The electron current was nearly the same in all three cases, while the ion current increased roughly in proportion to the pressure (some change in the electron current also occurred). The observed ionization rate as a function of gate voltage compared to the ionization cross-section as a function of electron energy. The observed ionization rate increases with gate potential between 40 and 95V, while the cross-section remains relatively flat. This is due to the increase in trajectory.

Because the electron trajectory is short, it should be possible to create very brief ion pulses using this method (<1 ns). Relatively long pulses will allow higher ionization rates. Because the arrays are small and the ion energy distribution is not too large, it should be possible to focus the ion beam to a spot size similar to the area of the array (0.64 mm2).

EXAMPLE

We have measured up to 10 mA and 3.5 A/cm2 from carbon nanotube field emitter arrays (CNT-FEAs) at gate voltages from 41 to 85 V. We grew the CNTs inside 1.5 µm diameter open apertures lined with 0.25 µm of SiO2 using DC plasma chemical vapor deposition (CVD). The oxide liner helped position the CNTs in the center of the cells and reduced the gate current by preventing the carbon nanotubes from contacting the gate. The apertures were spaced 4 microns apart in 100×100 or 200×200 cell arrays. occupying areas of 0.16 mm2 or 0.64 mm2, respectively.

The fabrication sequence was similar to that described except that DC plasma CVD was used in place of hot-filament assisted CVD for the growth of the CNTs. Arrays larger than 40 emitter cells were fabricated. Briefly 1.5 µm diameter hole arrays were photolithographically patterned on 100 nm thick chrome gate metal on 1 µm thick thermal SiO2 on a Si(100) substrate by lift-off. Using the chrome as etch mask, we reactive ion etched (RIE) through the SiO2 and a fraction of a micron into the Si substrate. A blanket low pressure CVD SiO2 layer was then deposited over the substrate, followed by RIE etch back to remove it from the top of the substrate and the bottom of the apertures, leaving the aperture sidewalls lined with a 0.25 µm thick CVD oxide spacer. A 10 nm thick Ni catalyst was then sputter-deposited over the sample, followed by glancing angle sputtering removal of the catalyst from the top horizontal surfaces (chrome and spacer). DC plasma CVD at 700 oC using acetylene and ammonia using conditions similar to those from our previous work was used to grow the CNTs on the bottoms and the sidewalls of the apertures. Most of the CNTs had diameters between 10-20 nm.

Emission measurements were carried out in a UHV chamber (base pressure<1×10−10 Torr) equipped with movable wire probes to contact the array gates and to collect the emitted electrons. No pre-treatment of the arrays was carried out prior to measurement. Typically the anode wire was positioned 1 mm above the array and held at 200 V and the anode current was independent of anode voltage. Five different arrays from three separate CNT growth runs produced anode current densities greater than 1 A/cm2. Many other arrays produced currents greater than 1 mA. The concave-up curvature of the FN plot is probably caused by emission from CNTs with different field enhancement, due to varying diameters, lengths, and tips per aperture. We operated one array for six days at 65 V; after the first 24 hrs the current stabilized and remained above 200 µA. The likely causes for the initial drop include the evaporation and blunting. A CNT-in open aperture emitter cell of very thin CNTs by field desorption and the desorption of H2O.

The above description is that of a preferred embodiment of the invention. Various modifications and variations are possible in light of the above teachings. It is therefore to be understood that, within the scope of the appended claims, the invention may be practiced otherwise than as specifically described. Any reference to claim elements in the singular, e.g., using the articles "a," "an," "the," or "the" is not construed as limiting the element to the singular.

What is claimed is:

1. An integrally gated carbon nanotube field ionizer device comprising:
    a substrate containing a cavity and a gate;
    a first insulator layer positioned between said substrate and said gate;
    an aperture in said gate and said first insulator layer forming an interior wall;
    a second insulator layer on said interior wall;
    a metallization layer on said second insulator layer;
    a catalyst layer on said metallization layer;
    a carbon nanotube on said catalyst layer and in electrical contact with the substrate and electrically insulated from the gate;
    a collector;
    wherein the gate is biased negative with respect to the carbon nanotube and substrate;
    wherein the collector is biased more negative than the gate;
    wherein an analyte is channeled and field ionized via the cavity from the backside and through to contact the carbon nanotube;
    wherein the resulting positive ion is then accelerated toward the collector; and
    wherein a second positive ion is produced within a nanosecond.

2. The integrally gated carbon nanotube field ionizer device of claim 1 wherein the device operates with pressures in excess of 1 Torr in the aperture.

3. The integrally gated carbon nanotube field ionizer device of claim 1 wherein the device is configured in a line source configuration to produce neutron source to reduce scanning time in PFNA.

4. The device of claim 1 wherein a gas or a liquid containing analytes has access to said carbon nanotube via channeling through the cavity from the backside and field ionized.

5. The device of claim 1 wherein said metallization layer is a conductor with strong adhesion to said second insulator and is selected from the group consisting of Cr, Ti, W, Ta, and TiN.

6. The device of claim 1 wherein said catalyst layer is selected from the group consisting of Ni, Co, Fe, Pd, alloys thereof, and combinations thereof.

7. The device of claim 1 further comprising multiple carbon nanotubes.

8. A field ionization device comprising an array of multiple devices as in claim 1.

9. An integrally gated carbon nanotube field ionizer device comprising:
    a first insulator layer on a first side of a substrate;
    a conductive gate layer on said first insulator layer;
    a cavity in said substrate;
    a portion of said first insulator layer over said cavity;
    an aperture in said portion of said first insulator layer and said conductive gate layer thereby forming an aperture sidewall;
    a second insulator layer on said aperture sidewall on said first insulator layer and optionally surface of said cavity;
    a metallization layer over said second insulator layer;
    a catalyst layer on said metallization layer on sidewall of said second insulator on said aperture sidewall;
    a carbon nanotube on said catalyst layer and in electrical contact with the substrate and electrically insulated from the gate;
    a collector;
    wherein the gate is biased negative with respect to the carbon nanotube and substrate;
    wherein the collector is biased more negative than the gate;

wherein an analyte can be channeled and field ionized via the cavity from the backside and through to contact the carbon nanotube;

wherein the resulting positive ion is then accelerated toward the collector; and wherein a second positive ion is produced within a nanosecond.

10. The integrally gated carbon nanotube field ionizer device of claim 9 wherein the device operates with pressures in excess of 1 Torr in the aperture.

11. The integrally gated carbon nanotube field ionizer device of claim 9 wherein the device is configured in a line source configuration to produce neutron source to reduce scanning time in PFNA.

12. The device of claim 9 wherein said cavity is made by etching a second side of said substrate to near said first insulator layer, wherein said second side is opposite said first side.

13. The device of claim 9 further including a collector located near said carbon nanotube and wherein said collector is biased more negative than said conductive gate layer.

14. A method of producing ion pulses with nanosecond rise under gas pressures as high as 1 Torr or more, wherein the ions are produced by an integrally gated carbon nanotube field ionizer device comprising:

a substrate containing a cavity and a gate;

a first insulator layer positioned between said substrate and said gate;

an aperture in said gate and said first insulator layer forming an interior wall;

a second insulator layer on said interior wall;

a metallization layer on said second insulator layer;

a catalyst layer on said metallization layer;

a carbon nanotube on said catalyst layer and in electrical contact with the substrate and electrically insulated from the gate;

a collector;

wherein the gate is biased negative with respect to the carbon nanotube and substrate;

wherein the collector is biased more negative than the gate;

wherein an analyte is channeled and field ionized via the cavity from the backside and through to contact the carbon nanotube;

wherein the resulting positive ion is then accelerated toward the collector; and wherein a second positive ion is produced within a nanosecond.

15. The method of claim 14 wherein the device operates with pressures in excess of 1 Torr in the aperture.

16. The method of claim 14 wherein the device is configured in a line source configuration to produce neutron source to reduce scanning time in PFNA.

17. A method of producing ion pulses with nanosecond rise under gas pressures as high as 1 Torr or more, wherein the ions are produced by an integrally gated carbon nanotube field ionizer device comprising:

a substrate containing a cavity and a gate;

a first insulator layer positioned between said substrate and said gate;

an aperture in said gate and said first insulator layer forming an interior wall;

a second insulator layer on said interior wall;

a metallization layer on said second insulator layer;

a catalyst layer on said metallization layer;

a carbon nanotube on said catalyst layer and in electrical contact with the substrate and electrically insulated from the gate;

a collector;

wherein the gate is biased positive with respect to the carbon nanotube and substrate;

wherein an analyte is channeled and field ionized via the cavity from the backside and through to contact the carbon nanotube; and wherein the resulting electrons are field emitted from the carbon nanotubes and the electrons subsequently create ions.

18. The method of claim 17 wherein the response time for creating ions is lengthened by the transit time of the electrons and wherein the transit time can be controlled by varying the negative voltage applied to the collector or an electrode.

19. The method of claim 17 further including channeling an analyte from the backside via the cavity and through to contact the carbon nanotube where the analyte is field ionized.

20. The method of claim 17 further including channeling a gas or a liquid containing analytes to said carbon nanotube via channeling through the cavity from the backside and field ionizing.

21. The method of claim 17 further comprising multiple carbon nanotubes.

* * * * *